(12) United States Patent
Nishimura

(10) Patent No.: US 6,577,150 B1
(45) Date of Patent: Jun. 10, 2003

(54) TESTING APPARATUS AND METHOD OF MEASURING OPERATION TIMING OF SEMICONDUCTOR DEVICE

(75) Inventor: Yasumasa Nishimura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/197,871

(22) Filed: Jul. 19, 2002

(30) Foreign Application Priority Data

Dec. 25, 2001 (JP) ........................................ 2001-392324

(51) Int. Cl.[7] .............................................. G01R 31/26
(52) U.S. Cl. ........................ 324/765; 324/617; 702/89
(58) Field of Search ................................ 324/765, 617, 324/677, 76.22, 158.1, 532, 535; 365/63, 201, 207, 230.04, 189.09; 702/69, 79, 89, 125; 327/158, 149, 161; 375/376

(56) References Cited

U.S. PATENT DOCUMENTS 6,404,663 B2 * 6/2002 Shinozaki .................... 365/63
6,480,435 B2 * 11/2002 Nakamura et al. .......... 365/207

* cited by examiner

*Primary Examiner*—Kamand Cuneo
*Assistant Examiner*—Trung Q. Nguyen
(74) *Attorney, Agent, or Firm*—McDermott, Will & Emery

(57) ABSTRACT

A testing apparatus and method which can easily measure and evaluate, on a tester, transistor characteristics of a wafer of the same lot or wafer, and can measure high-speed operation timing in a high precision.

The testing apparatus comprises measuring means 20 for measuring transistor characteristics of a circuit for transistor characteristics extraction that is formed in advance and belongs to the same lot or wafer as a lot or wafer of a subject semiconductor device, storage means 13 for storing measurement values of the measuring means as parameters, circuit simulation means 30 for performing a circuit simulation on a measurement system using the parameters stored in the storage means, and for storing resulting operation timing in the storage means, actual measurement means 12 for actually measuring operation timing of the subject semiconductor device, and for comparing a resulting actual measurement value with the operation timing that is obtained by the circuit simulation and is stored in the storage means, and a CPU 11 for controlling of the above means.

5 Claims, 5 Drawing Sheets

Fig. 3 (A) reference clock
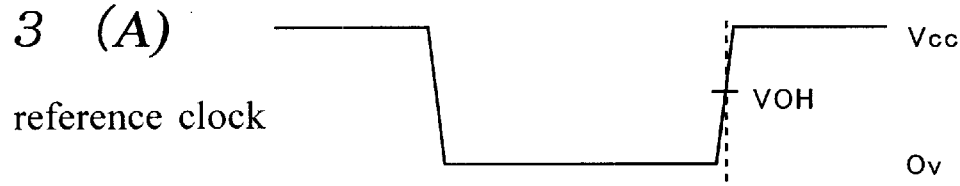
Fig. 3 (B) "H" data input
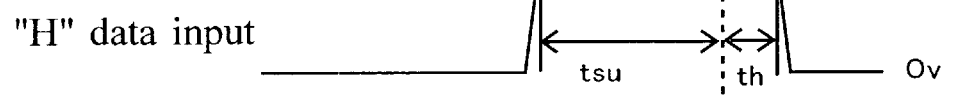
Fig. 3 (C) "L" data input
(setup times) tsu ≦ product specification tsu
(hold times) th ≦ product specification th
Fig. 4 (A) "H" data input
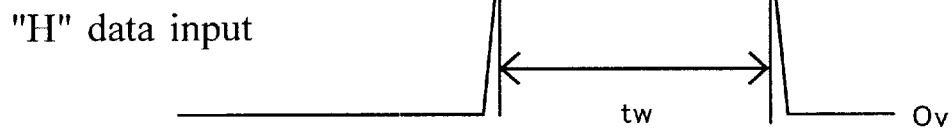
Fig. 4 (B) "L" data input
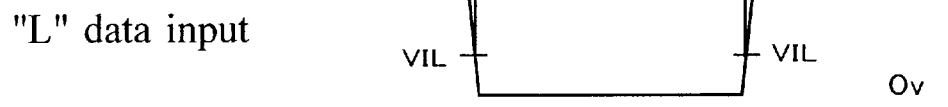
(input pulse width) tw ≦ product specification tw Fig. 5 (A)
reference clock
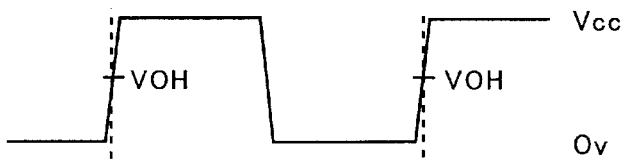
Fig. 5 (B)
"H" data output
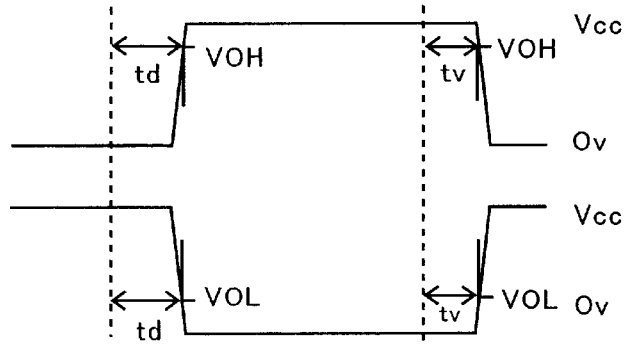
Fig. 5 (C)
"L" data output
(delay time)td ≦ product specificationtd
(data valid time)tv ≧ product specificationtv
Fig. 6 (A)
"H" data output
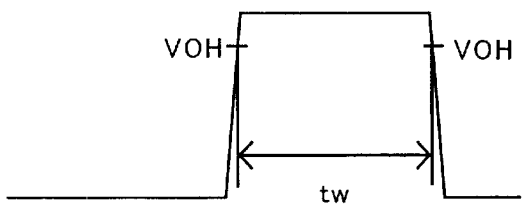
Fig. 6 (B)
"L" data output
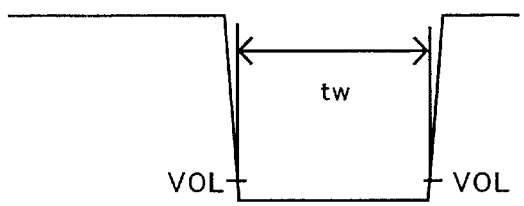
(output pulse width)tw ≧ product specificationtw

TESTING APPARATUS AND METHOD OF MEASURING OPERATION TIMING OF SEMICONDUCTOR DEVICE

BACKGROUND OF THE INVENTION

1. Field of the Invention

The present invention relates to a testing apparatus and method of testing operation timing of a semiconductor device. In particular, the present invention relates to a testing apparatus and method which perform a circuit simulation using parameters to check operation timing of a semiconductor device and test operation timing of the semiconductor device using a result of the circuit simulation.

2. Description of Related Art

With advances of the semiconductor wafer process technology and the circuit technology, the operation speeds of large-capacity semiconductor devices are becoming higher increasingly. In this connection, the technology of testing such devices, in particular, the technology of measuring operation timing such as an access time of a high-speed device with high accuracy, is becoming important.

Conventionally, as for high-accuracy access time measurement, not only is a subject device (hereinafter referred to as "DUT") measured with a tester but also the following measure is taken. Electrical characteristics of a measurement jig, the driver and the comparator of a tester, and the output buffer circuit of the DUT are modeled. An electrical characteristic simulation is performed in advance with Spice (a circuit simulator), for example, by using the modeled electrical characteristics. Operation timing obtained as a simulation result is compared with operation timing as a result of an actual measurement on the DUT, to increase the measurement accuracy.

Specifically, a reason for a difference between a circuit simulation value and an actual measurement value is investigated, influences of the reason are recognized quantitatively, and problems of the measurement system are improved.

Conventionally, since an operation timing of a semiconductor device is judged in the above-described manner, the characteristics of the output buffer transistor of a DUT tend to be influenced more by a wafer process variation as the operation speed of the DUT increases, which is a factor in causing a difference between a circuit simulation result and a DUT actual measurement value. A largest factor in causing such a difference is thought to be employing, as characteristics of the output buffer circuit of a DUT that is incorporated in a circuit simulation, transistor parameters obtained by measuring a wafer of a different lot from the lot of the DUT. Where timing measurement on a DUT and measurement of transistor parameters to be used for a circuit simulation are performed separately, the circuit simulation may not be accurate enough to cover the actual measurement. As a result, there may occur a case that erroneous Spice transistor parameters (due to a difference between wafer process lots) are used as they are in the circuit simulation, to produce an erroneous measurement result. It is expected that such an error will become more noticeable as the operation speed of a device increases.

SUMMARY OF THE INVENTION

The present invention has been achieved in view of the above problems, and an object of the invention is therefore to provide a testing apparatus and method which can easily measure and evaluate, on a tester, transistor characteristics of a wafer of the same lot or wafer as the lot or wafer of a DUT to obtain transistor parameters for a Spice circuit simulation and which can prevent an error of the above kind by measuring high-speed operation timing of the DUT using the transistor parameters thus obtained.

According to a first aspect of the present invention, there is provided a testing apparatus for measuring operation timing of a semiconductor device, comprising: measuring means for measuring transistor characteristics of a circuit for transistor characteristics extraction that is formed in advance and belongs to the same lot or wafer as a lot or wafer of a subject semiconductor device; storage means for storing measurement values of the measuring means as parameters; circuit simulation means for performing a circuit simulation on a measurement system using the parameters stored in the storage means, and for storing resulting operation timing in the storage means; actual measurement means for actually measuring operation timing of the subject semiconductor device, and for comparing a resulting actual measurement value with the operation timing that is obtained by the circuit simulation and is stored in the storage means; and a CPU for controlling the measuring means, the storage means, the circuit simulation means, and the actual measurement means.

According to a second aspect of the present invention, there is provided a testing method of measuring operation timing of a semiconductor device, wherein a difference between an actual measurement value of operation timing of a subject semiconductor device and operation timing obtained by a circuit simulation is detected by the testing apparatus according to the present testing apparatus of claim 1 or 2.

According to a third aspect of the present invention, there is provided a testing method of measuring operation timing of a semiconductor device, comprising the steps of: measuring transistor characteristics of a circuit for transistor characteristics extraction that was formed in advance and belongs to the same lot or wafer as a lot or wafer of a subject semiconductor device; storing measurement values of the transistor characteristics as parameters; performing a circuit simulation on a measurement system using the parameters, and storing resulting operation timing; and actually measuring operation timing of the subject semiconductor device, comparing a resulting actual measurement value with the operation timing that was obtained by the circuit simulation, and modifying a test program for operation timing measurement when the difference between the actual measurement value of the operation timing of the subject semiconductor device and the operation timing obtained by the circuit simulation is greater than or equal to a predetermined value.

The above and other objects, effects, features and advantages of the present invention will become more apparent from the following description of the embodiments thereof taken in conjunction with the accompanying drawings.

BRIEF DESCRIPTION OF THE DRAWINGS

FIGS. 3(A) to 3(C) show specific examples of the above-described actual measurement of a DUT access time.

FIGS. 4(A) and 4(B) show an example of measuring an input pulse width.

FIGS. 5(A) to 5(C) relate to exemplary switching tests.

FIGS. 6(A) and 6(B) show an example of measuring an output pulse width.

DETAILED DESCRIPTION OF THE PREFERRED EMBODIMENT

Figure 1:
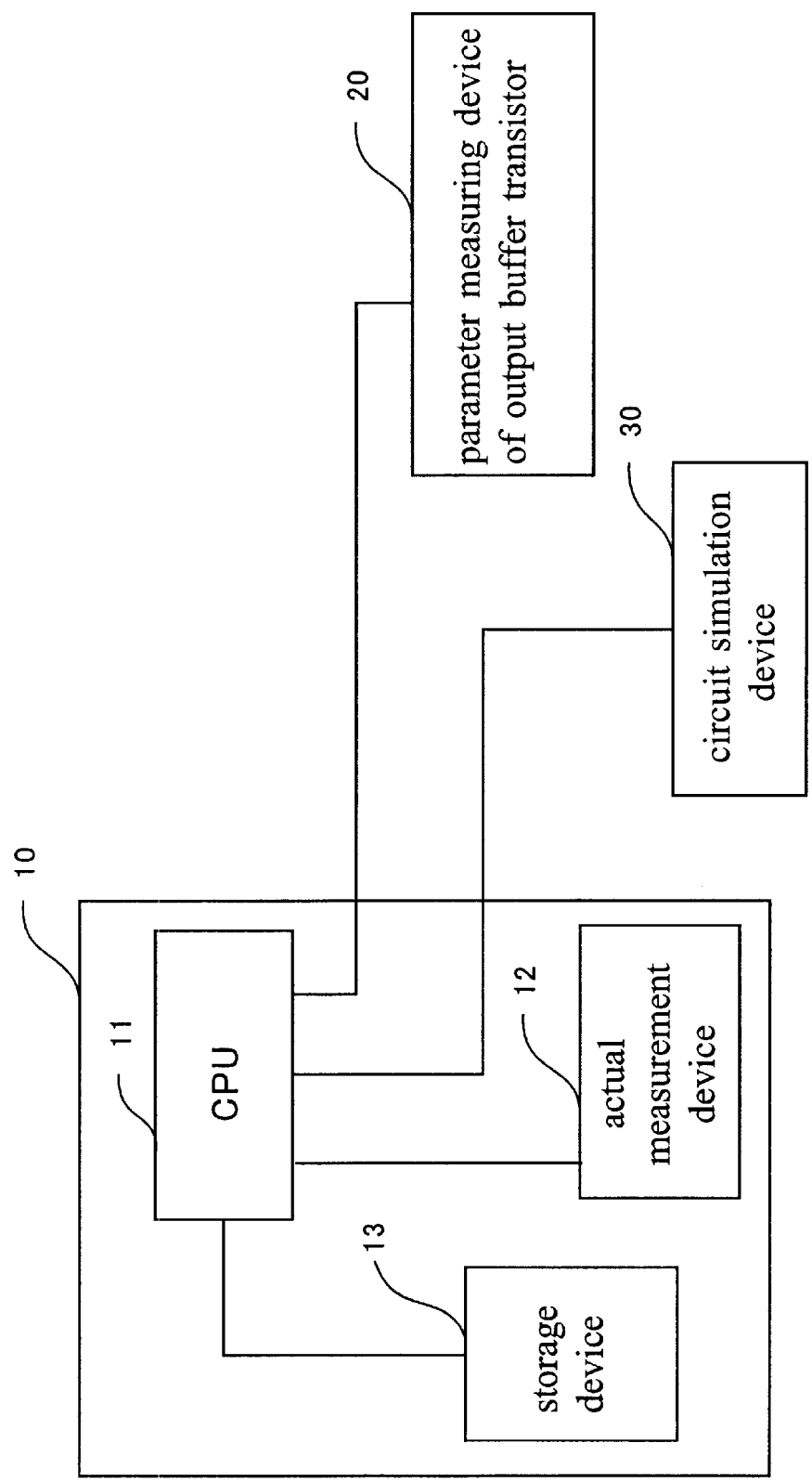
FIG. 1 is a block diagram showing a configuration of the first embodiment.

Embodiments of the present invention will be described below with reference to the accompanying drawings. It is noted that the same reference symbols in the drawings denote the same or corresponding components.

First Embodiment

A first embodiment of the present invention will be hereinafter described with reference to the drawings. FIG. 1 is a block diagram showing a configuration of the embodiment. As shown in FIG. 1, a tester 10 has a central processing unit (hereinafter referred to as "CPU") 11, an actual measurement device 12 for actually measuring operation timing, for example, an access time, of a DUT under a control of the CPU 11, and a storage device 13 for storing parameters (described later) and a circuit simulation result.

A parameter measuring device 20 measures parameters of a transistor under a control of the CPU 11, and stores the measured parameters in the storage device 13. A circuit simulation device 30 performs a circuit simulation on a measurement system using the parameters stored in the storage device 13, and stores a result of the circuit simulation in the storage device 13.

Figure 2:
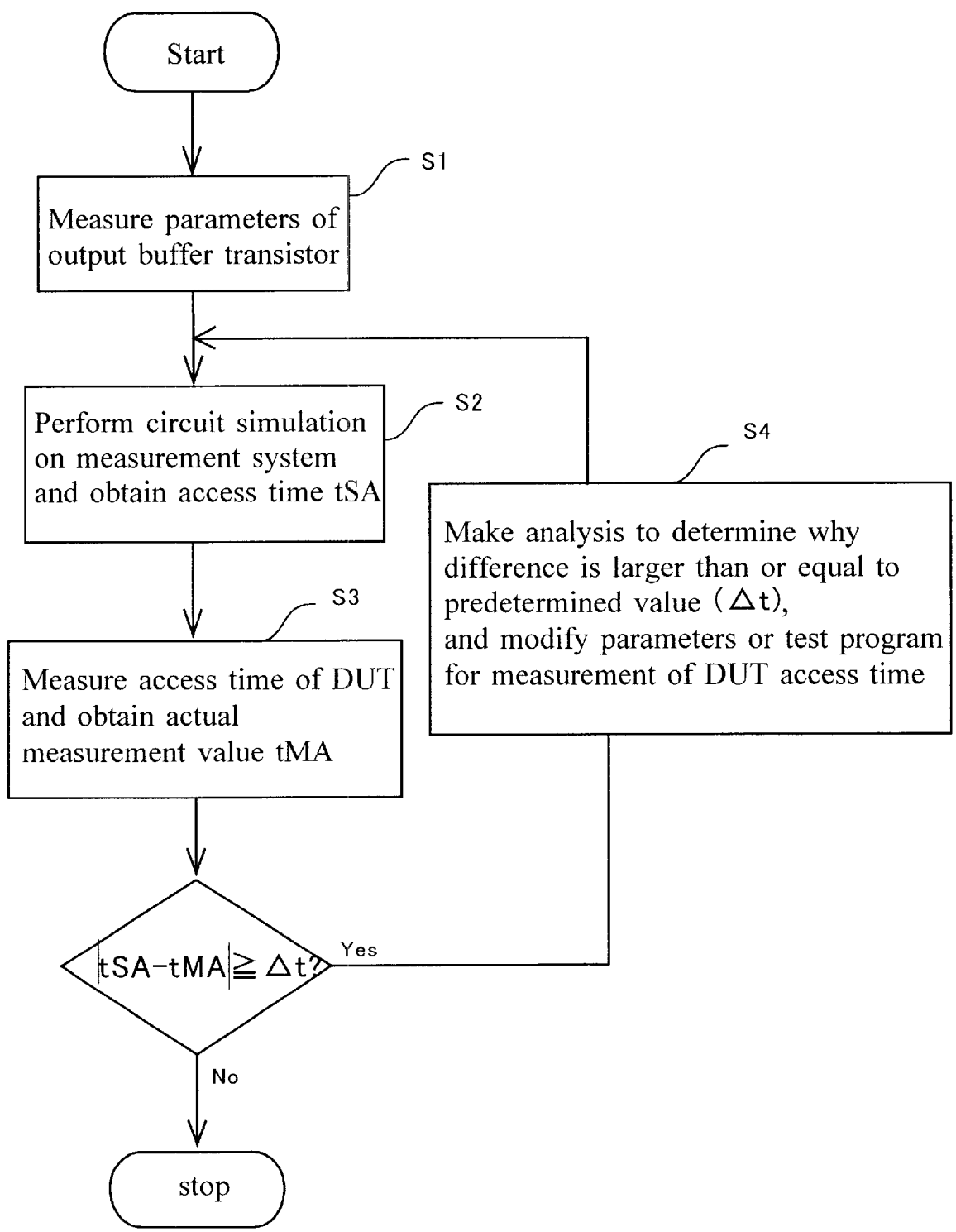
FIG. 2 is a test flowchart for explaining an operation timing measurement and evaluation procedure according to the first embodiment

Next, an operation timing measurement and evaluation procedure according to the embodiment will be described with reference to a test flowchart of FIG. 2. This flowchart outlines a device test program that is provided in the tester 10 and shows a preprogrammed measurement procedure. First, at step S1, the CPU 11 of the tester 10 starts the parameter measuring device 20 and causes it to measure characteristic values of a circuit for transistor characteristics extraction (not shown) that was formed in advance and belongs to the same lot or wafer as the lot or wafer of a DUT (not shown) and to store the measured characteristic values in the storage device 13 as parameters.

At step S2, the, CPU 11 starts the circuit simulation device 30 and causes it to perform a circuit simulation on a measurement system using the parameters stored in the storage device 13 and to store, in the storage device 13, a simulation result (access time tSA) that is a propagation delay value of a certain path of the DUT (temporary storage).

At step S3, the actual measurement device 12 of the tester 10 actually measures an access time tMA of the DUT. Specific examples of the actual measurement will be described later.

At step S4, the access time tSA as the simulation result is compared with the actually measured access time tMA and it is checked whether the difference is larger than or equal to a prescribed value Δt. If the difference is smaller than Δt, the process is finished with a judgment that there are no problems. If the difference is larger than or equal to Δt, the process goes to step S4. At step S4, an analysis is made to determine a reason for the large difference and a circuit simulation is performed again, or the parameters or a test program for measurement of a DUT access time is modified or some other proper measure is taken so that a difference smaller than Δt will be obtained.

FIGS. 3(A) to 3(C) to FIGS. 6(A) to 6(B) show specific examples of the above-described actual measurement of a DUT access time. Among those drawings, FIGS. 3(A) to 3(C) and FIGS. 4(A) and 4(B) relate to exemplary time tests. More specifically, FIGS. 3(A) to 3(C) show an example of measuring a input setup time and a hold time.

A reference clock signal shown in FIG. 3(A) is input externally to the data input terminal of the DUT with timing that is prescribed by a product specification, and H data shown in FIG. 3(B) and L data shown in FIG. 3(C) are input to the DUT. A setup time tsu and a hold time th (see FIGS. 3(B) and 3(C)) are obtained as times between a time point of a prescribed level VOH in a specification of the reference clock signal and time points when each input signal crosses an input judgment level (VIH or VIL) that is prescribed by the product specification. A judgment to the effect that the operation is normal is made if the measured setup times tsu and hold times th are shorter than or equal to product specification tsu and th, respectively, that are prescribed in the product specification.

FIGS. 4(A) and 4(B) show an example of measuring an input pulse width. H data and L data shown in FIGS. 4(A) and 4(B), respectively, are input to the DUT. A pulse width tw is obtained as a time between time points when each input signal crosses an input judgment level (VIH or VIL) that is prescribed by the product specification. A judgment to the effect that the operation is normal is made if the measured pulse widths tw are shorter than or equal to a product specification tw that is prescribed by the product specification.

FIGS. 5(A) to 5(C) and FIGS. 6(A) and 6(B) relate to exemplary switching tests. In the example of FIGS. 5(A) to 5(C), a reference clock signal shown in FIG. 5(A) is input to the DUT and H data shown in FIG. 5(B) and L data shown in FIG. 5(C) are output from the DUT. A delay time td and a data valid time tv (see FIGS. 5(B) and 5(C)) are obtained as times between time points of a level VOH of the reference clock signal and time points when each output signal crosses an output judgment level (VOH or VOL) that is prescribed by the product specification. As for the delay time td, a judgment to the effect that the operation is normal is made if it is shorter than or equal to a product specification td that is prescribed by the product specification. As for the data valid time tv, a judgment to the effect that the operation is normal is made if it is longer than or equal to a product specification tv that is prescribed by the product specification.

FIGS. 6(A) and 6(B) show an example of measuring an output pulse width. A pulse width tw is obtained as a time between time points when each of H data shown in FIG. 6(A) and L data shown in FIG. 6(B) that are output from the DUT crosses an output judgment level (VOH or VOL) that is prescribed by the product specification. A judgment to the effect that the operation is normal is made if the measured pulse widths tw are longer than or equal to a product specification tw that is prescribed by the product specification.

Second Embodiment

Figure 7:
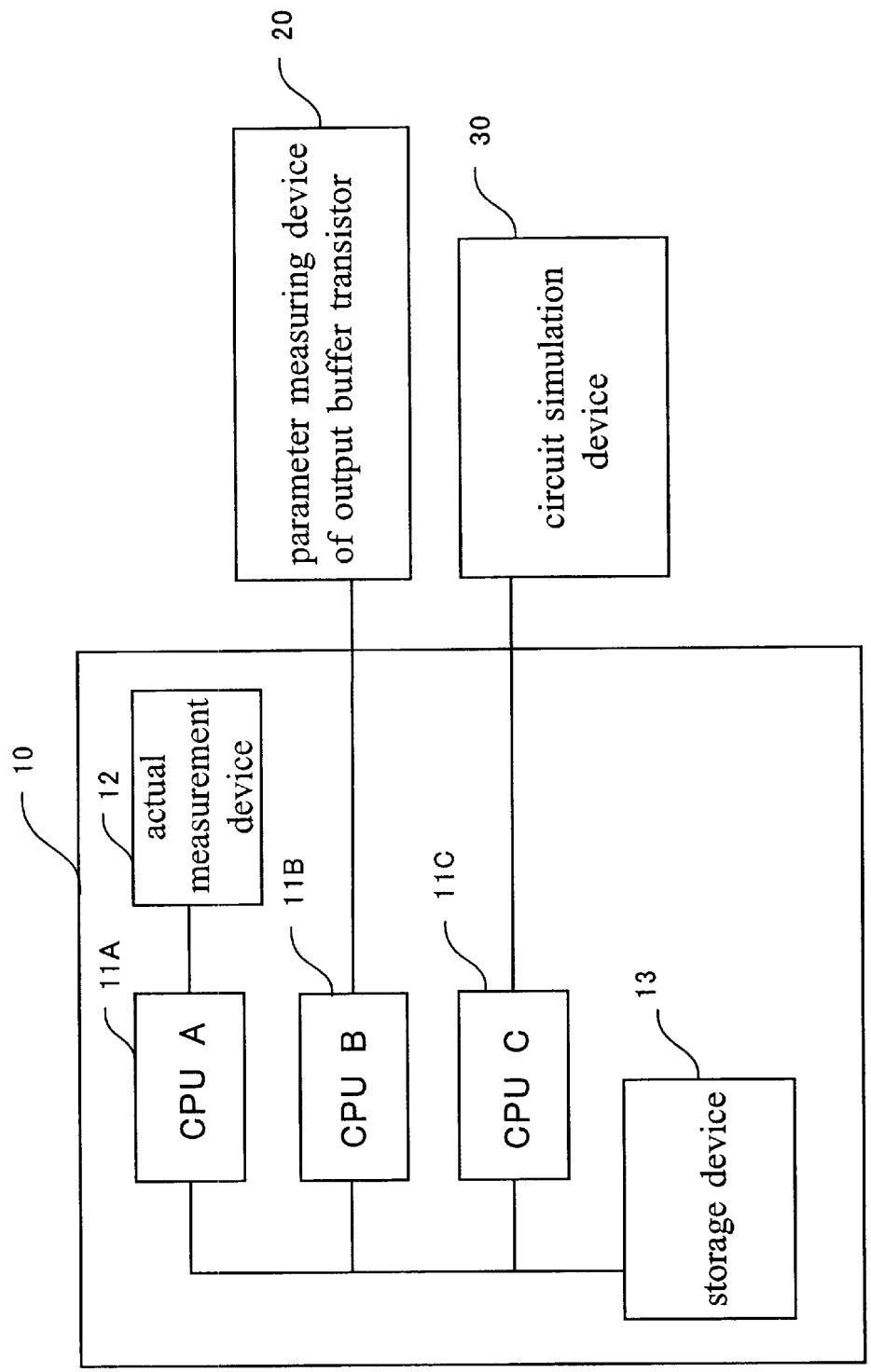
FIG. 7 is a block diagram showing a configuration of the second embodiment.

Next, a second embodiment of the invention will be described with reference to FIG. 7. FIG. 7 is a block diagram showing a configuration of the second embodiment. Components in FIG. 7 having the same or corresponding components in FIG. 1 are given the same reference numerals as the latter and will not be described. The second embodiment is different from the first embodiment of FIG. 1 in that three CPUs, that is, a first CPU 11A, a second CPU 11B, and a third CPU 11C, are provided. The three CPUs 11A–11C share the control functions. Specifically, the first CPU 11A controls the actual measurement device 12 and the storage device 13, the second CPU 11B controls the parameter measuring device 20 and the storage device 13, and the third CPU 11C controls the circuit simulation device 30 and the storage device 13. The measurement operation of the second embodiment is the same as that of the first embodiment and hence will not be described.

A testing apparatus according to the invention for measuring operation timing of a semiconductor device may comprise measuring means for measuring transistor characteristics of a circuit for transistor characteristics extraction that was formed in advance and belongs to the same lot or wafer as a lot or wafer of a subject semiconductor device; storage means for storing measurement values of the measuring means as parameters; circuit simulation means for performing a circuit simulation on a measurement system using the parameters stored in the storage means, and for storing resulting operation timing in the storage means; actual measurement means for actually measuring operation timing of the subject semiconductor device, and for comparing a resulting actual measurement value with the operation timing that was obtained by the circuit simulation and is stored in the storage means; and a CPU for controlling the measuring means, the storage means, the circuit simulation means, and the actual measurement means. Therefore, transistor characteristics of a wafer of the same lot or wafer as the lot or wafer of a DUT can easily be measured and evaluated on a tester, and high-speed operation timing of the DUT can be measured with high accuracy.

In the above testing apparatus, the CPU may comprise a first CPU for controlling operation of the actual measurement means and the storage means, a second CPU for controlling operation of the measuring means and the storage means, and a third CPU for controlling operation of the circuit simulation means and the storage means. With this configuration, the load of each CPU is light and hence a high-accuracy measurement is enabled.

A testing method of measuring operation timing of a semiconductor device, wherein a difference between an actual measurement value of operation timing of a subject semiconductor device and operation timing obtained by a circuit simulation may be detected by the testing apparatus according to the above testing apparatus.

A testing method according to the present invention for measuring operation timing of a semiconductor device comprises the steps of measuring transistor characteristics of a circuit for transistor characteristics extraction that was formed in advance and belongs to the same lot or wafer as a lot or wafer of a subject semiconductor device; storing measurement values of the transistor characteristics as parameters; performing a circuit simulation on a measurement system using the parameters, and storing resulting operation timing; and actually measuring operation timing of the subject semiconductor device, and comparing a resulting actual measurement value with the operation timing that was obtained by the circuit simulation. Therefore, the measurement accuracy of high-speed operation timing in a tester can be increased.

The above testing method may further comprise the step of modifying a test program for operation timing measurement if the difference between the actual measurement value of the operation timing of the subject semiconductor device and the operation timing obtained by the circuit simulation is greater than or equal to a prescribed value. This makes it possible to perform a timing measurement with even higher accuracy.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 2001-392324 filed on Dec. 25, 2001 including specification, claims, drawings and summary are incorporated herein by reference in its entirety.

What is claimed is:

1. A testing apparatus for measuring operation timing of a semiconductor device, comprising:

measuring means for measuring transistor characteristics of a circuit for transistor characteristics extraction that is formed in advance and belongs to the same lot or wafer as a lot or wafer of a subject semiconductor device;

storage means for storing measurement values of said measuring means as parameters;

circuit simulation means for performing a circuit simulation on a measurement system using the parameters stored in said storage means, and for storing resulting operation timing in said storage means;

actual measurement means for actually measuring operation timing of the subject semiconductor device, and for comparing a resulting actual measurement value with the operation timing that is obtained by the circuit simulation and is stored in said storage means; and a CPU for controlling said measuring means, said storage means, said circuit simulation means, and said actual measurement means.

2. The testing apparatus according to claim 1, wherein said CPU comprises:

a first CPU for controlling operation of said actual measurement means and said storage means;

a second CPU for controlling operation of said measuring means and said storage means; and a third CPU for controlling operation of said circuit simulation means and said storage means.

3. A testing method of measuring operation timing of a semiconductor device, wherein a difference between an actual measurement value of operation timing of a subject semiconductor device and operation timing obtained by a circuit simulation is detected, by the testing apparatus according to claim 1.

4. The testing method according to claim 3, further comprising the step of modifying a test program for operation timing measurement when the difference between the actual measurement value of the operation timing of the subject semiconductor device and the operation timing obtained by the circuit simulation is greater than or equal to a predetermined value.

5. A testing method of measuring operation timing of a semiconductor device, comprising the steps of:

measuring transistor characteristics of a circuit for transistor characteristics extraction that was formed in advance and belongs to the same lot or wafer as a lot or wafer of a subject semiconductor device;

storing measurement values of the transistor characteristics as parameters;

performing a circuit simulation on a measurement system using the parameters, and storing resulting operation timing;

actually measuring operation timing of the subject semiconductor device, and comparing a resulting actual measurement value with the operation timing that was obtained by the circuit simulation, and modifying a test program for operation timing measurement when the difference between the actual measurement value of the operation timing of the subject semiconductor device and the operation timing obtained by the circuit simulation is greater than or equal to a predetermined value.

* * * * *